United States Patent
Wang et al.

(10) Patent No.: US 10,672,831 B2
(45) Date of Patent: Jun. 2, 2020

(54) HIGH DENSITY MEMORY ARCHITECTURE USING BACK SIDE METAL LAYERS

(71) Applicant: Intel Corporation, Santa Clara, CA (US)

(72) Inventors: Yih Wang, Portland, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/594,595

(22) Filed: Oct. 7, 2019

(65) Prior Publication Data

US 2020/0043980 A1 Feb. 6, 2020

Related U.S. Application Data

(63) Continuation of application No. 15/575,667, filed as application No. PCT/US2015/033757 on Jun. 2, 2015, now Pat. No. 10,483,321.

(51) Int. Cl.
*H01L 27/24* (2006.01)
*H01L 43/08* (2006.01)
*H01L 27/22* (2006.01)
*H01L 45/00* (2006.01)
*H01L 43/02* (2006.01)
(Continued)

(52) U.S. Cl.
CPC .......... *H01L 27/226* (2013.01); *H01L 27/228* (2013.01); *H01L 27/2436* (2013.01); *H01L 27/2454* (2013.01); *H01L 43/02* (2013.01); *H01L 43/08* (2013.01); *H01L 45/04* (2013.01); *H01L 45/1233* (2013.01); *G11C 11/161* (2013.01); *G11C 13/0002* (2013.01); *G11C 2213/71* (2013.01)

(58) Field of Classification Search
CPC ..... H01L 27/226; H01L 27/228; H01L 45/04; H01L 27/2425; H01L 27/2436; H01L 43/02; H01L 43/08; H01L 45/1223; G11C 11/161; G11C 2213/71
USPC ...................... 257/5, 686, 758; 438/118, 622
See application file for complete search history.

(56) References Cited

U.S. PATENT DOCUMENTS

| 8,952,500 B2 | 2/2015 | Huang et al. |
| 2006/0030110 A1 | 2/2006 | Kumura et al. |

(Continued)

FOREIGN PATENT DOCUMENTS

TW    201142990    12/2011

OTHER PUBLICATIONS

Notice of Allowance from European Patent Application No. 15894436.3 dated Dec. 13, 2019, 13 pgs.

(Continued)

*Primary Examiner* — Thinh T Nguyen
(74) *Attorney, Agent, or Firm* — Green, Howard & Mughal LLP

(57) ABSTRACT

A microelectronic memory having metallization layers formed on a back side of a substrate, wherein the metallization layers on back side may be used for the formation of source lines and word lines. Such a configuration may allow for a reduction in bit cell area, a higher memory array density, and lower source line and word line resistances. Furthermore, such a configuration may also provide the flexibility to independently optimize interconnect performance for logic and memory circuits.

20 Claims, 8 Drawing Sheets

(51) Int. Cl.
*G11C 11/16* (2006.01)
*G11C 13/00* (2006.01)

(56) References Cited

U.S. PATENT DOCUMENTS

| | | |
|---|---|---|
| 2007/0275533 A1 | 11/2007 | Vaed et al. |
| 2008/0175036 A1 | 7/2008 | Oh et al. |
| 2008/0247225 A1* | 10/2008 | Liu ................... H01L 27/2436 365/163 |
| 2009/0034323 A1 | 2/2009 | Lung et al. |
| 2010/0044759 A1 | 2/2010 | Burnstein et al. |
| 2010/0230735 A1 | 9/2010 | Zhu |
| 2012/0236620 A1 | 9/2012 | Sim |
| 2013/0051115 A1 | 2/2013 | En et al. |
| 2014/0264235 A1 | 9/2014 | Gong et al. |
| 2014/0293677 A1 | 10/2014 | Kim |

OTHER PUBLICATIONS

Extended European Search Report from European Patent Application No. 15894436.3 dated Dec. 19, 2018, 6 pgs.
International Preliminary Report on Patentability from PCT/US2015/033757 dated Mar. 2, 2016, 10 pgs.
International Search Report and Written Opinion from PCT/US2015/033757 dated Mar. 2, 2016, 13 pgs.
Non-Final Office Action from Taiwan Patent Application No. 105112848 dated Jun. 14, 2019, 17 pgs.
Non-Final Office Action from U.S. Appl. No. 15/575,667 dated Feb. 21, 2019, 13 pgs.
Notice of Allowance from U.S. Appl. No. 15/575,667 dated Jul. 23, 2019, 9 pgs.
Restriction Requirement from U.S. Appl. No. 15/575,667 dated Nov. 1, 2018, 10 pgs.
Notice of Allowance from Taiwan Patent Application No. 105112848 dated Oct. 22, 2019, 3 pgs.

* cited by examiner

HIGH DENSITY MEMORY ARCHITECTURE USING BACK SIDE METAL LAYERS

CLAIM OF PRIORITY

This application is a continuation of, and claims priority to, U.S. patent application Ser. No. 15/575,667, filed on Nov. 20, 2017 and titled "HIGH DENSITY MEMORY ARCHITECTURE USING BACK SIDE METAL LAYERS", which is a National Stage Entry of, and claims priority to, PCT Application No. PCT/US2015/033757, filed on Jun. 2, 2015 and titled "HIGH DENSITY MEMORY ARCHITECTURE USING BACK SIDE METAL LAYERS", which is incorporated by reference in its entirety for all purposes.

TECHNICAL FIELD

Embodiments of the present description relate to the field of microelectronic devices, and, more particularly, to the fabrication of non-volatile microelectronic memory, which include a least one back side metal layer.

BACKGROUND

Modern microelectronic processors, such as central processing units (CPUs), use embedded cache memory to speed up the performance of the microelectronic processor and/or to meet memory bandwidth requirements, such as with System-on-Chip (SoC) devices. To implement an embedded cache memory with the highest level of integration density, as many bit cells as possible are placed on each bit line, source line and word line of the embedded cache memory. As will be understood to those skilled in the art, the lengths of bit line and word line increase proportionally with the number of bit cells on each. For example, the typical lengths of bit line and word line in an embedded cache memory can be in the order of tens of micrometers in a 22 nm logic process technology. However, the use of long bit lines and word lines may result in the performance of embedded cache memory becoming ever more increasingly sensitive to interconnect resistance, particularly as the size of the embedded cache memory is scaled down and width of the bit lines and word lines reduces. Such resistance may be particularly problematical for resistance-based memory technologies, such as Spin-Transfer Torque (STT) MRAM (Magnetoresistive Random Access Memory) and ReRAM (Resistive Random Access Memory), wherein reducing source line, bit line, and word line resistances with the minimum bit cell area has become one of the top challenges for successful integration of these resistance-based memory technologies. Therefore, there is a need to develop new memory architectures for resistance-based memory to alleviate performance and density limitations caused by high source line and word line resistance and to accommodate limited pitch scaling of the widths of the bit lines and word lines.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
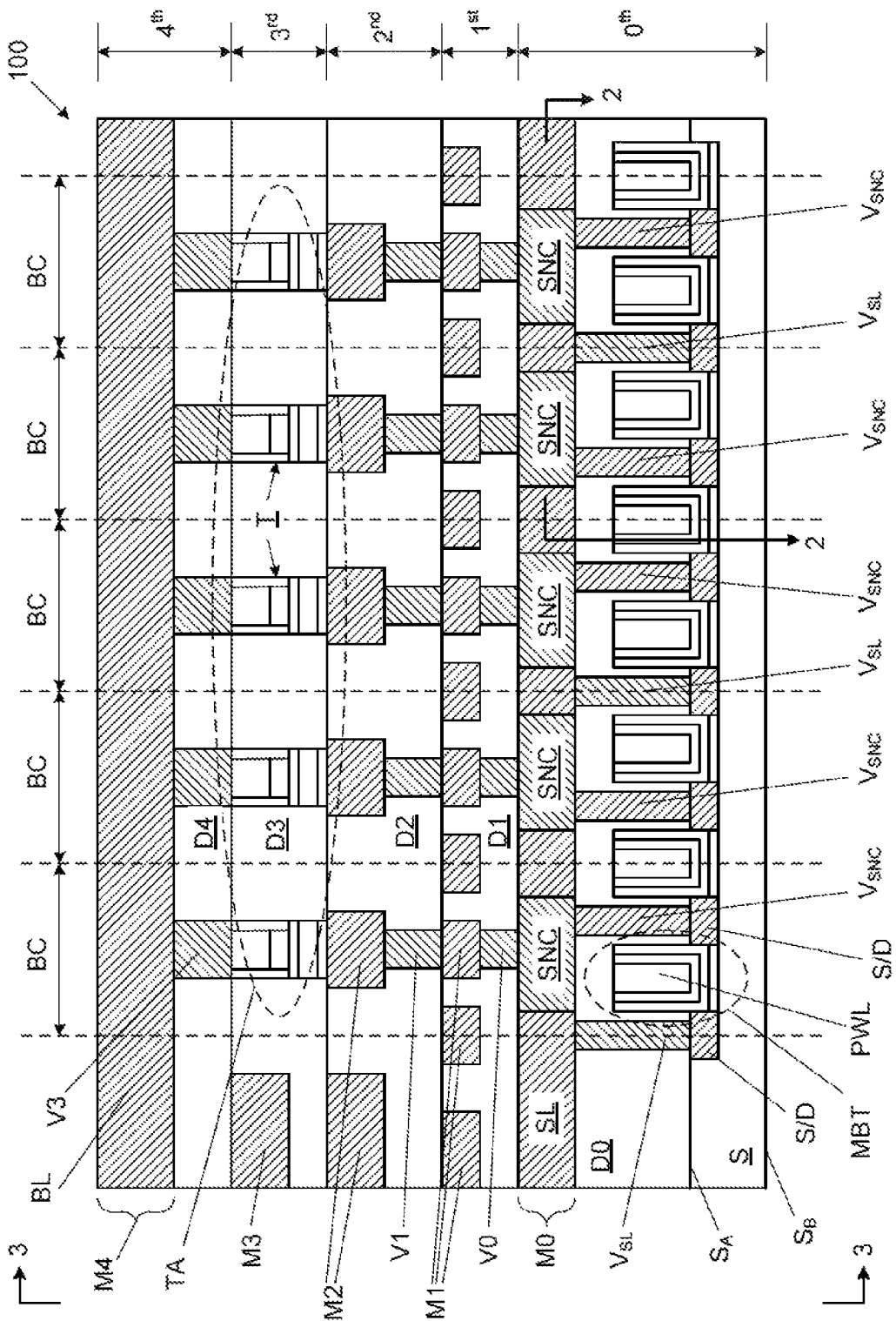
FIG. 1 illustrates side cross sectional view of a microelectronic memory, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer or component with respect to other layers or components. One layer/component "over" or "on" another layer/component or bonded "to" another layer/component may be directly in contact with the other layer/component or may have one or more intervening layers/components. One layer/component "between" layers/components may be directly in contact with the layers/components or may have one or more intervening layers/components.

It is understood that the cross-sectional view may not be a perfect cross-sectional view in the strict sense, as portions of microelectronic memory may not be shown in order to not block the view of components, which allows for an understand of the positions of the relevant components. Furthermore, for the purpose of clarity and conciseness, various layers, components, and materials are not shown (such as diffusion barriers, adhesion/wetting layers, barrier liners, conductive fill materials, and the like).

FIG. 1 illustrates a cross-sectional view of a portion of a microelectronic memory 100, as known in the art. The microelectronic memory 100 may include a plurality of levels, illustrated as $0^{th}$, $1^{st}$, $2^{nd}$, $3^{rd}$ and $4^{th}$. The $0^{th}$ level may include a substrate S having an front side $S_f$ and an opposing back side $S_b$. A plurality of memory bitcell transistors MBT may be formed on and/or in the substrate S at the front side $S_f$ thereof. The memory bitcell transistors MBT each include a word line, such as a polysilicon word line PWL, as a part of the memory bitcell transistors MBT. A plurality of source/drain structures S/D may be formed in the substrate S for the operation of the memory bitcell transistors MBT. The source/drain structures S/D may be formed by doping the substrate S with an appropriate n-type or p-type dopant, as will be understood to those skilled in the art. The components, structure, and functioning of such memory bitcell transistors MBT are well known in the art, and, for the sake of brevity and conciseness, will not be described herein. A dielectric material D0 may be formed over the substrate front side $S_f$ and the memory bitcell transistors MBT and a metallization layer M0 may be formed on or in the dielectric material D0, wherein the metallization layer M0 may be used to form source lines SL and storage node contacts SNC, as well as other signal routing structures (not shown). The source lines SL may be connected to their respective source/drain structure S/D with a source line conductive via $V_{SL}$ and the storage node contacts SNC may be connected to their respective source/ structure S/D with a storage node contact via $V_{SNC}$.

As further shown in FIG. 1, at least one addition level, shown as the $1^{st}$ level and the $2^{nd}$ level may be formed, respectively, on the $0^{th}$ level. The $1^{st}$ level may include a metallization layer M1 (traces/lines) that may be in communication with respective storage node contacts SNC through vias V0 extending through the dielectric layer D1 and the $2^{nd}$ level may include a metallization layer M2 (trace/lines) that may be in communication with respective storage node contacts SNC through vias V1 extending through the dielectric layer D2.

The microelectronic memory 100 may include a plurality of memory cell transistors T (illustrated as magnetic tunnel junction transistors) in an array TA. The memory cell transistors T are illustrated as being formed in the $3^{rd}$ level and may each be connected to storage node contacts SNC through the metallization layers M1 and M2, and vias V0 and V1, of the $1^{st}$ level and the $2^{nd}$ level, respectively.

As further shown in FIG. 1, the $4^{th}$ level may be formed on the $3^{rd}$ level, wherein the $4^{th}$ level may include a metallization layer M4 including a bit line BL, wherein the bit line BL is electrically connected to the memory cell transistors T through vias V3 extending through a dielectric layer D4 of the 4th level.

Figure 2:
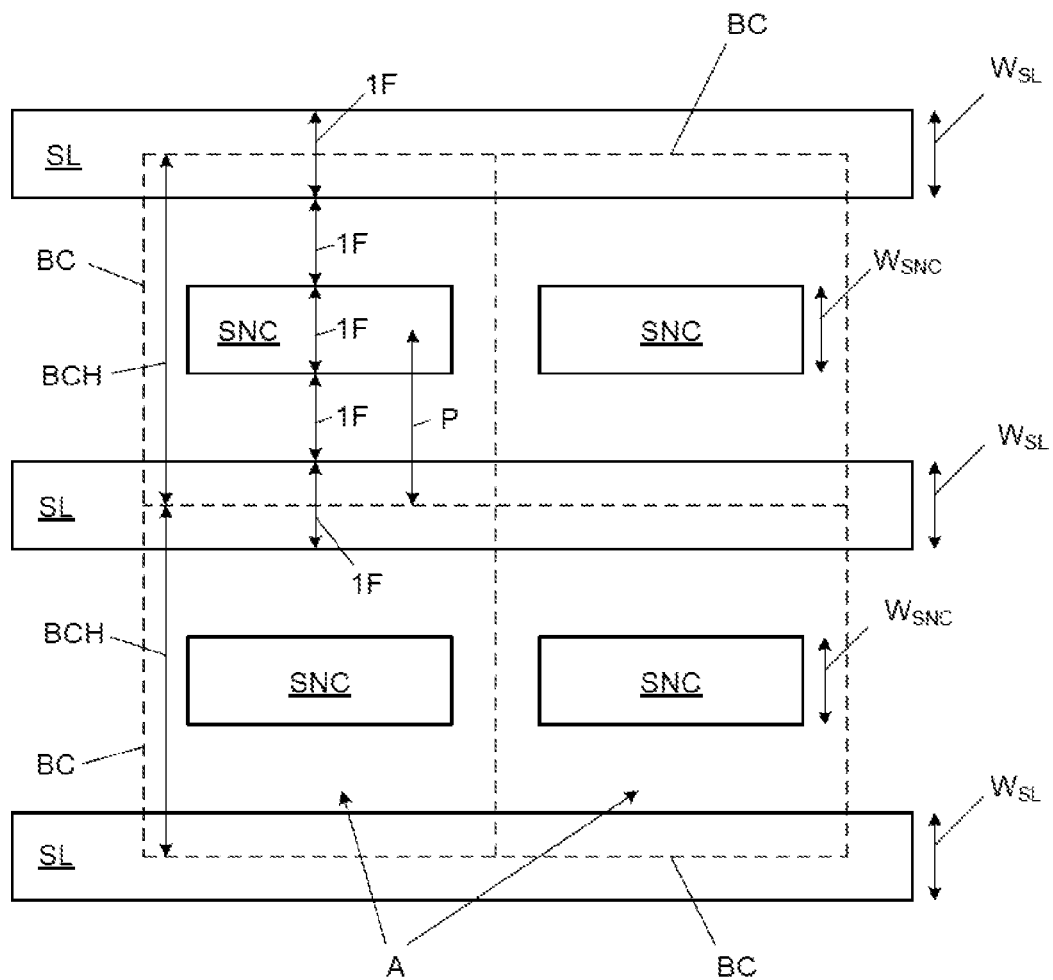
FIG. 2 illustrates side cross sectional view of source lines and storage node contacts of the microelectronic memory along line 2-2 of FIG. 1, as known in the art.

FIG. 2 illustrates the top cross-sectional view of the metallization layer M0 of the 0th level illustrating the source lines SL and storage node contacts SNC, and the demarcation of bit cells BC with dash lines (see also FIG. 1). As illustrated, the formation of the source lines SL and the storage node contacts SNC within the metallization layer M0 may limit the dimension of each bit cell BC. As shown, a bit cell height BCH is equal to two times of a pitch P (center-to-center distance between the structures) or 4F, where F is a half pitch P of the structures. As the bit cell height BCH is limited by the pitch P, widths of the structures (i.e. the source line width $W_{SL}$ and the storage node contact width $W_{SNC}$) may be reduced in order to reduce an area A of each bit cell BC. However, this may increase resistance and degrade performance, as will be understood to those skilled in the art. Furthermore, reducing resistances by increasing the thickness the structure may not be an option in conventional processes as dimensions of the structures are typically determined by the performance requirement of logic circuits outside of memory area.

Figure 3:
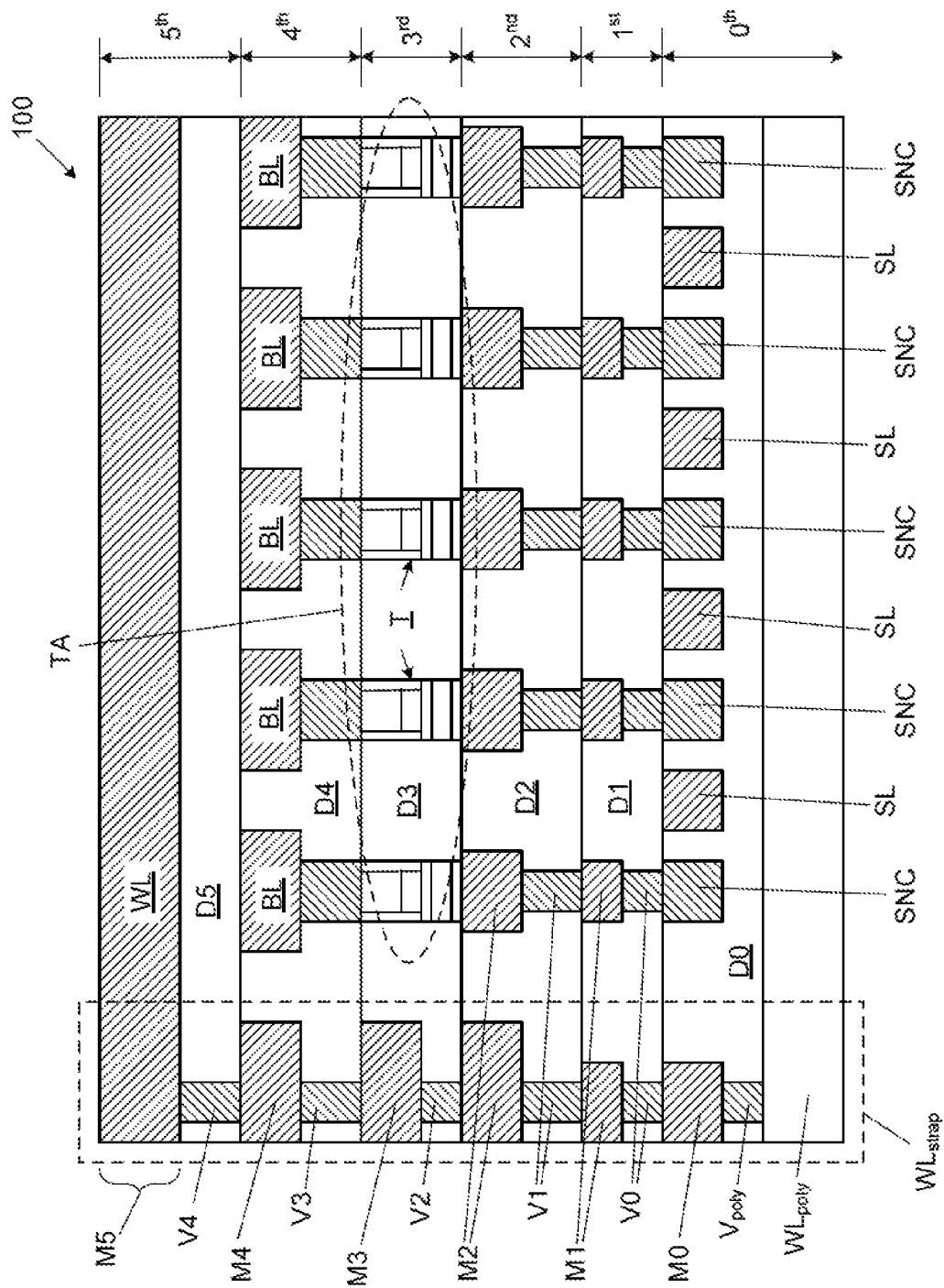
FIG. 3 illustrates side cross sectional view of a microelectronic memory along line 3-3 of FIG. 1, as known in the art.

FIG. 3 illustrates a cross sectional view of the microelectronic memory 100 along line 3-3 of FIG. 1 with an additional level, $5^{th}$ level, formed on the $4^{th}$ level, and without all the structures of the $0^{th}$ level for clarity. The 5th level may include a dielectric layer D5 and a metallization layer M5, wherein the metallization layer includes a word line WL. The word line WL may be electrically connected to the metallization layer M4 through at least one via V4 extending through the dielectric layer D5. As illustrated in FIG. 3, the microelectronic memory 100 would have a word strap line $WL_{strap}$ that would extend from the poly word line PWL of the $0^{th}$ level to the word line WL of the $5^{th}$ level through the various metallizations (e.g. M0, M1, M2, M3, and M4) and vias (e.g. $V_{poly}$, V0, V1, V2, V3, and V4). As will be understood to those skilled in the art, the placement of the word line strap $WL_{strap}$ interrupts the memory cell transistor array TA in the 3rd level, and, as there will be numerous word line straps $WL_{strap}$ within the microelectronic memory in order reduce word line resistance and deal, the word line straps $WL_{strap}$ may have a significant impact on a density of the memory cell transistor array TA.

The dielectric layers (e.g. D0-D5) may be any appropriate dielectric material, including but not limited to, silicon dioxide ($SiO_2$), silicon oxynitride ($SiO_xN_y$), and silicon nitride ($Si_3N_4$) and silicon carbide (SiC), liquid crystal polymer, epoxy resin, bismaleimide triazine resin, polyimide materials, and the like, as well as low-k and ultra low-k dielectrics (dielectric constants less than about 3.6), including but not limited to carbon doped dielectrics, fluorine doped dielectrics, porous dielectrics, organic polymeric dielectrics, silicon based polymeric dielectrics, and the like, and may be formed by any known technique, including, but not limited, chemical vapor deposition, physical vapor deposition, coating, lamination, and the like.

The metallization layers (e.g. M0-M5) and vias (e.g. $V_{poly}$ and V0-V4) may be made by any known process, such as photolithography and plating, and may be any appropriate conductive material, such as metals, including but not limited to copper, silver, nickel, gold, aluminum, tungsten, cobalt, and alloys thereof, and the like. The substrate S may be any appropriate substrate, including, but not limited to, a silicon-containing substrate.

Embodiments of the present description relate to forming a microelectronic memory having metallization layers formed on a back side of a substrate, wherein the metallization layers may be used for the formation of source lines and word lines. Such a configuration may allow for a reduction in bit cell area, a higher memory array density, and lower source line and word line resistances. Furthermore, such a configuration may also provide the flexibility to independently optimize interconnect performance for logic and memory circuits.

Figure 4:
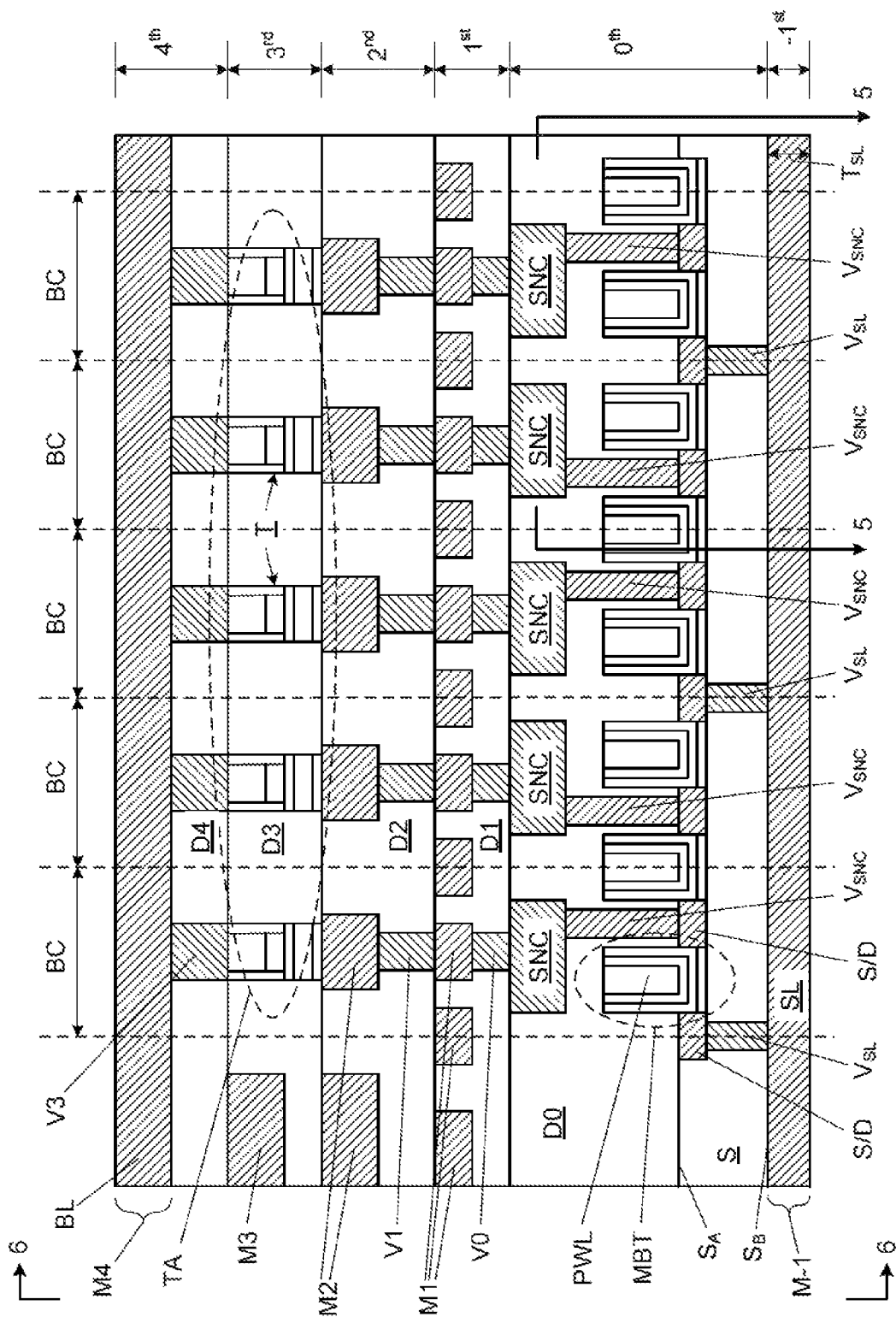
FIG. 4 illustrates side cross sectional view of a microelectronic memory having at least one metallization layer formed proximate a back side of a substrate, according to an embodiment of the present description.

As illustrated in FIG. 4, a microelectronic memory 150 may be formed with the source line SL proximate the substrate back side $S_b$ within a metallization layer M-1 of a $-1^{th}$ level. By moving the source line SL from a position proximate the substrate front side $S_f$ to a position proximate the substrate back side $S_b$, the bit cell area A (see FIGS. 5a and 5b) may be reduced as the source lines SL are no longer required to be in the same metallization as the storage node contacts SNC, as shown in FIG. 2, which will enable higher bit cell BC performance by reducing resistances.

As further shown in FIG. 4, the source line SL may be connected to the source/drain structure S/D through a deep diffusion contact DDC. The deep diffusion contact DDC may be formed by implanting a n-type dopant or a p-type dopant into the substrate S, as will be understood to those skilled in the art.

Figure 5A:
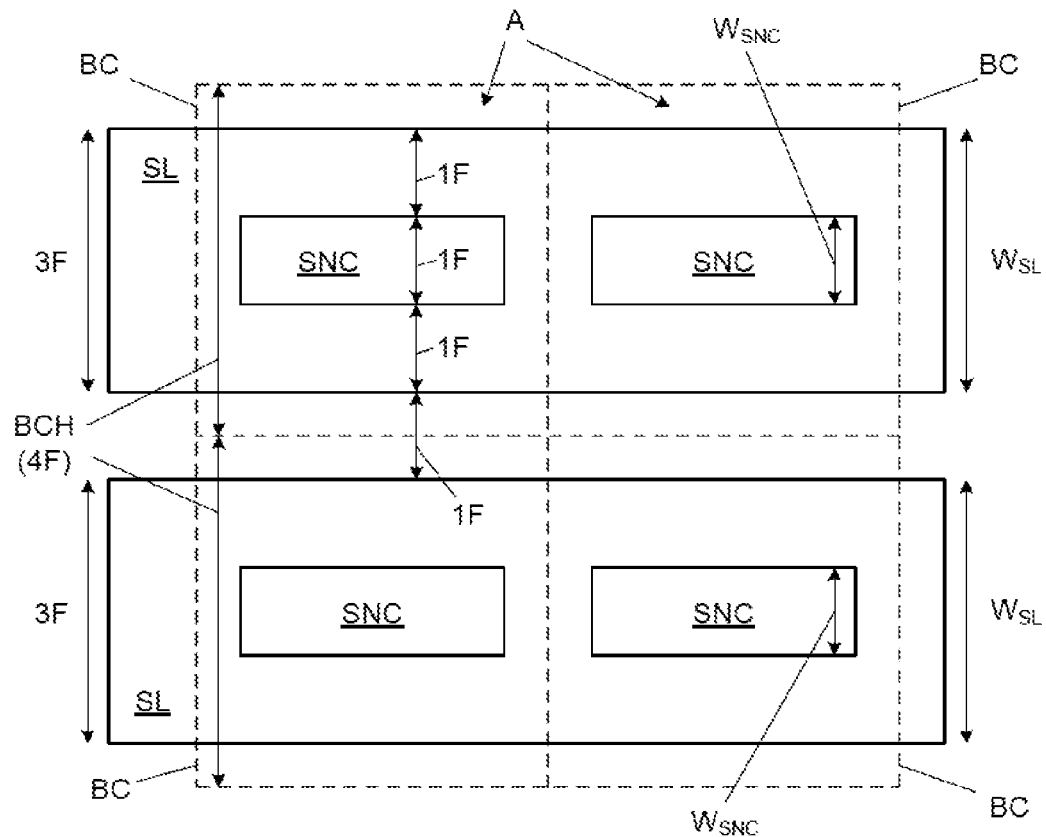
FIGS. 5a and 5b illustrates side cross sectional view of source lines and storage node contacts of the microelectronic memory having at least one metallization layer formed proximate a back side of a substrate, viewed along line 5-5 of FIG. 4, according to an embodiment of the present description.
Figure 5B:
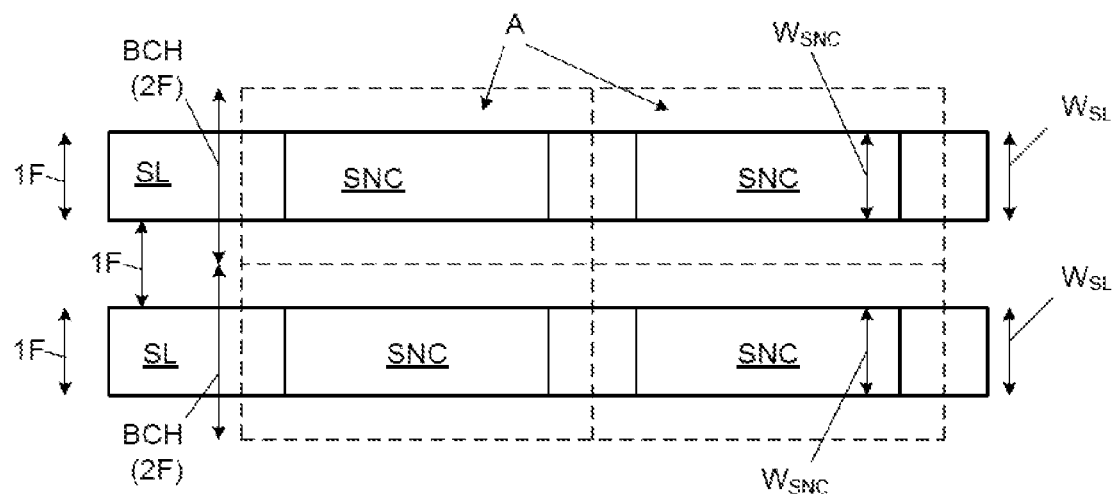

FIGS. 5a and 5b illustrate a view along line 5-5 of FIG. 4 showing only the source lines SL and the storage node contacts SNC without any intervening structures, so that the relative positions and sizes of the source lines SL and the node contacts SNC can be seen. As shown in FIG. 5a, the source line width $W_{SL}$ can be optimized for a high-speed application, wherein the source line width $W_{SL}$ can be increased by up to 3 times compared to the source line width $W_{SL}$ of FIG. 3, while maintaining the same area A of each bit cell BC, wherein the storage node contacts SNC are position directly, vertically over the source line SL. The increase in the source line width $W_{SL}$ can reduce the resistance thereof and result in increased read and write margin and increased speed, as will be understood to those skilled in the art. Furthermore, a thickness $T_{SL}$ of source line SL (see FIG. 4) can be further optimized to reduce source line resistance for resistance based memory.

As shown in FIG. 5b, the source line width $W_{SL}$ can be sized at its minimum for a high-density application, wherein the storage node contacts SNC may have a storage node contact width $W_{SNC}$ substantially the same as the source line width $W_{SL}$ and wherein the storage node contacts SNC may be positioned directly, vertically over the source line SL. This configuration allows for a reduction of the bit cell height BCH by as much as two times as compared to the bit cell height BCH of FIG. 2. Again, the thickness $T_{SL}$ of source line SL (see FIG. 4) can be further optimized to reduce source line resistance for resistance based memory.

Figure 6:
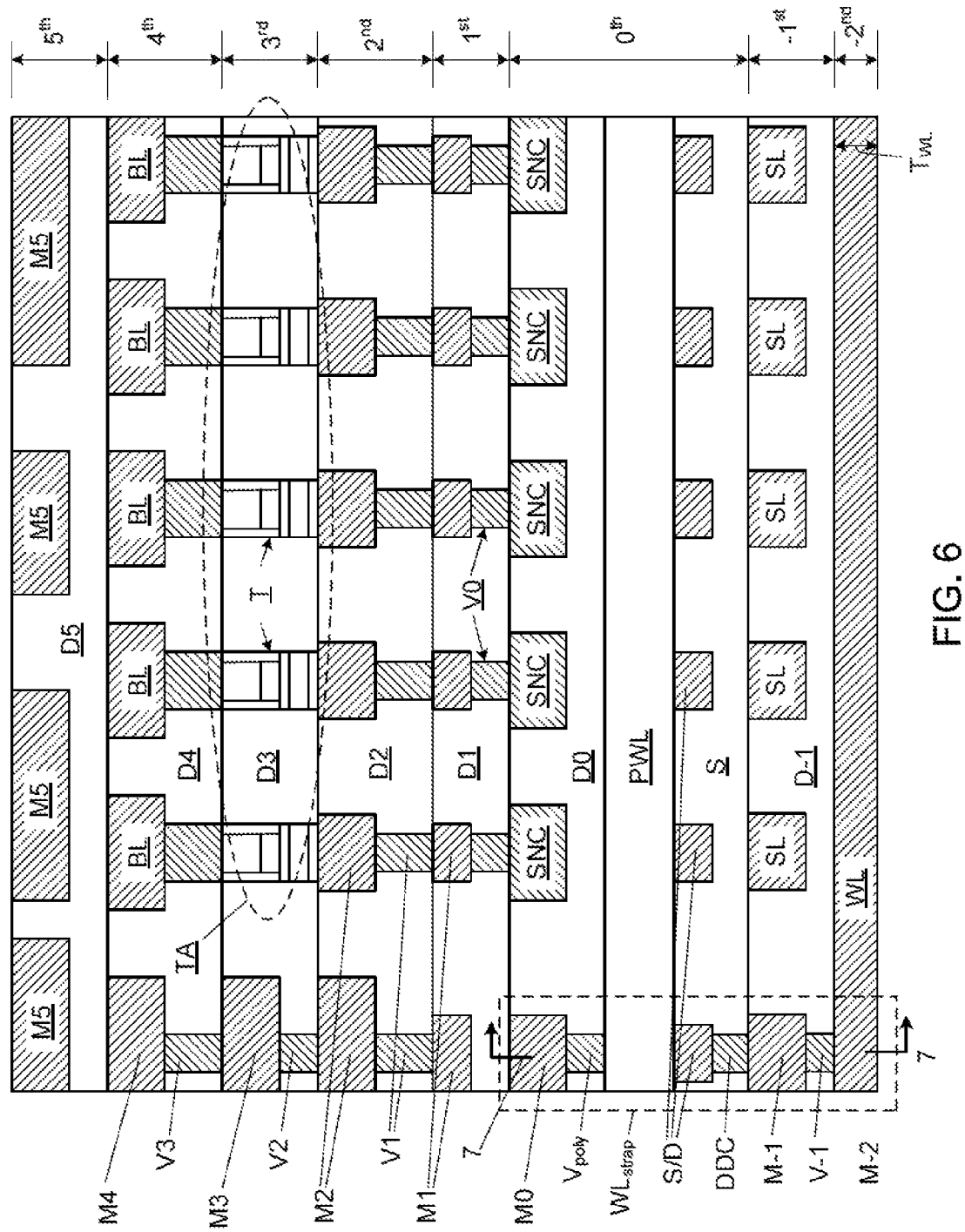
FIG. 6 illustrates side cross sectional view of a microelectronic memory along line 6-6 of FIG. 3, according to an embodiment of the present description.

FIG. 6 illustrates a cross sectional view of the microelectronic memory 150 along line 6-6 of FIG. 4 with an additional level, $-2^{nd}$ level, formed on the $-1^{st}$ level. The $-1^{st}$ level may include a dielectric layer D-1 and the $-2^{nd}$ level may include a metallization layer M-2, wherein the metallization layer includes the word line WL. The word line WL may be electrically connected to the metallization layer M-1 through at least one via V-1 extending through the dielectric layer D-1. A thickness $T_{WL}$ of word line WL can be optimized to reduce word line delay.

Figure 7:
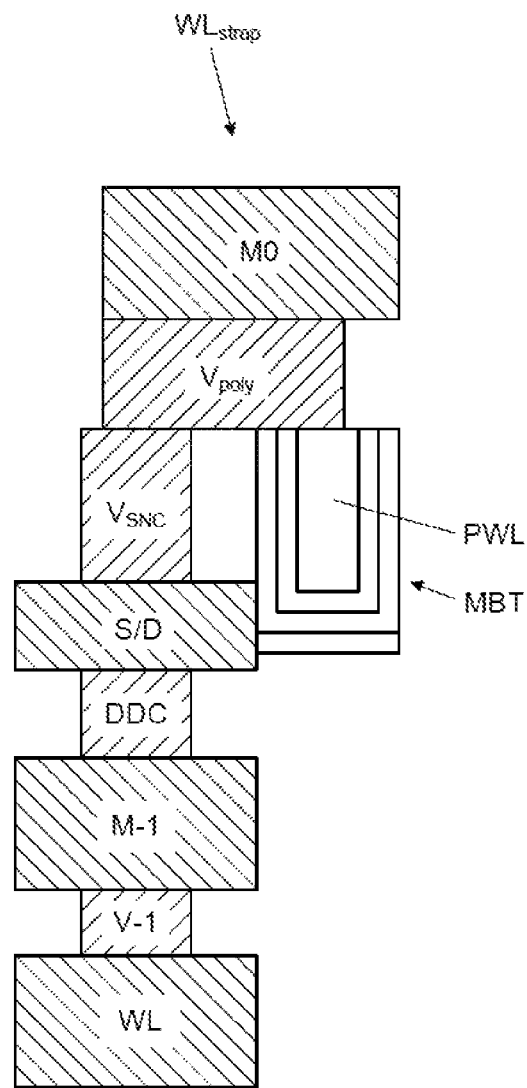
FIG. 7 illustrates side cross sectional view of a word line strap of the microelectronic memory along line 7-7 of FIG. 6, according to an embodiment of the present description.

As illustrated in FIG. 6, the microelectronic memory 150 would have the word line strap $WL_{strap}$ that would extend through the $0^{th}$ level, the $-1^{st}$ level, and the $-2^{nd}$ level. FIG. 7, which is a cross sectional view along line 7-7 of FIG. 5, illustrates the word line strap $WL_{strap}$ in greater detail without the dielectric layers. As shown in FIG. 7, the word line strap $WL_{strap}$ comprises an electrical path between the word line WL and the polysilicon word line PWL through the previously described structures including the deep diffusion contacts DDC and the source/drain structure S/D without additional area in substrate. Furthermore, the word line straps $WL_{strap}$ no longer disrupt the memory cell transistor array TA, as previously discussed.

Figure 8:
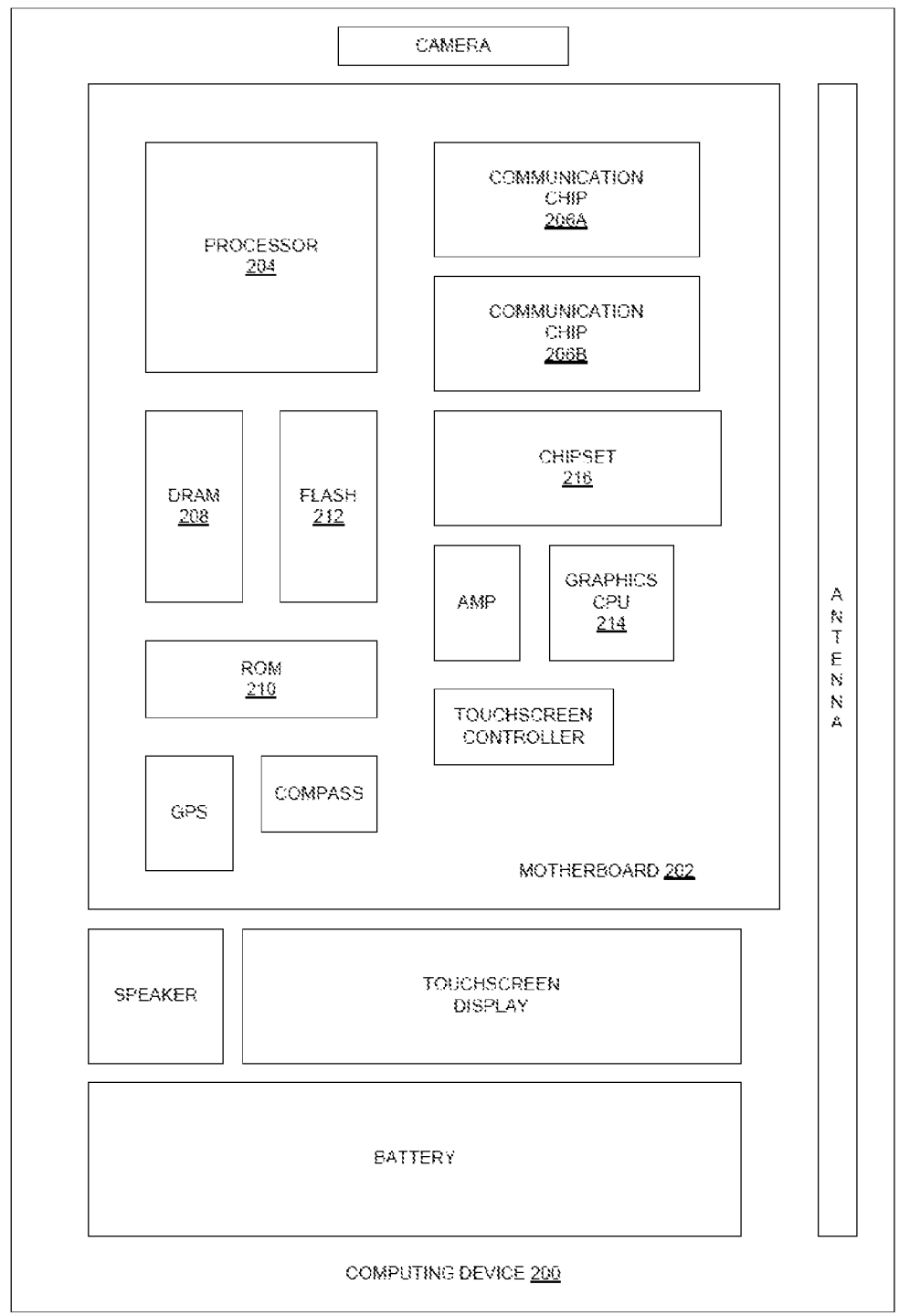
FIG. 8 illustrates a computing device in accordance with one implementation of the present description.

FIG. 8 illustrates a computing device 200 in accordance with one implementation of the present description. The computing device 200 houses a board 202. The board may include a number of microelectronic components, including but not limited to a processor 204, at least one communication chip 206A, 206B, volatile memory 208, (e.g., DRAM), non-volatile memory 210 (e.g., ROM), flash memory 212, a graphics processor or CPU 214, a digital signal processor (not shown), a crypto processor (not shown), a chipset 216, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 202. In some implementations, at least one of the microelectronic components may be a part of the processor 204.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 having embedded memory may include metallization layers proximate the substrate back side of the embedded memory, as described herein.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other microelectronic device and assembly applications, as will be understood to those skilled in the art.

The following examples pertain to further embodiments, wherein Example 1 is a conductive connector, comprising a microelectronic memory comprising a substrate having a front surface and an opposing back surface, a source line proximate the substrate back surface; and a memory bitcell transistor proximate the substrate front surface.

In Example 2, the subject matter of Example 1 can optionally include the memory bitcell transistor including at least one source/drain structure formed in the substrate, wherein the source line is electrically connected to the at least one source/drain structure.

In Example 3, the subject matter of Example 2 can optionally include the source line being electrically connected to the at least one source/drain structure through a deep diffusion contact within the substrate.

In Example 4, the subject matter of any of Examples 1 to 3 can optionally include a word line formed proximate the substrate back surface.

In Example 5, the subject matter of Example 4 can optionally include a word line strap comprising the word line proximate the substrate back surface electrically connected to a word line within a memory bitcell transistor.

In Example 6, the subject matter of Example 5 can optionally include the word line proximate the substrate back surface being electrically connected to a word line within a memory bitcell transistor through a source/drain structure and a deep diffusion contact within the substrate.

In Example 7, the subject matter of any of Examples 1 to 4 can optionally include a memory cell transistor array proximate the substrate front surface.

In Example 8, the subject matter of Example 7 can optionally include the memory cell transistor array comprising a plurality of resistance based memory transistors.

In Example 9, the subject matter of Example 8 can optionally include the plurality of resistance based memory transistors comprising a plurality of Spin-Transfer Torque (STT) MRAM (Magnetoresistive Random Access Memory) transistors.

In Example 10, the subject matter of Example 8 can optionally include the plurality of resistance based memory transistors comprising a plurality of ReRAM (Resistive Random Access Memory).

The following examples pertain to further embodiments, wherein Example 11 is a microelectronic memory comprising a substrate having a front surface and an opposing back surface, a word line proximate the substrate back surface, and a memory bitcell transistor proximate the substrate front surface.

In Example 12, the subject matter of Example 11 can optionally include a word line strap comprising the word line proximate the substrate back surface electrically connected to a word line within a memory bitcell transistor.

In Example 13, the subject matter of Example 11 can optionally include the word line proximate the substrate back surface being electrically connected to a word line within a memory bitcell transistor through a source/drain structure and a deep diffusion contact within the substrate.

In Example 14, the subject matter of Example 11 can optionally include a source line formed proximate the substrate back surface.

In Example 15, the subject matter of Example 14 can optionally include the memory bitcell transistor including at least one source/drain structure formed in the substrate, wherein the source line is electrically connected to the at least one source/drain structure.

In Example 16, the subject matter of Example 15 can optionally include the source line being electrically connected to the at least one source/drain structure through a deep diffusion contact within the substrate.

In Example 17, the subject matter of Example 11 to 16 can optionally include a transistor array proximate the substrate front surface.

In Example 18, the subject matter of Example 17 can optionally include the transistor array comprising a plurality of resistance based memory transistors.

In Example 19, the subject matter of Example 18 can optionally include the plurality of resistance based memory transistors comprising a plurality of Spin-Transfer Torque (STT) MRAM (Magnetoresistive Random Access Memory) transistors.

In Example 20, the subject matter of Example 18 can optionally include the plurality of resistance based memory transistors comprising a plurality of ReRAM (Resistive Random Access Memory).

The following examples pertain to further embodiments, wherein Example 21 is an electronic system, comprising a board; and a microelectronic component attached to the board, wherein the microelectronic component includes a microelectronic memory comprising: a substrate having a front surface and an opposing back surface; a source line proximate the substrate back surface; a memory bitcell transistor proximate the substrate front surface, wherein the memory bitcell transistor includes at least one source/drain structure formed in the substrate, wherein the source line is electrically connected to the at least one source/drain structure; a word line formed proximate the substrate back surface; a word line strap comprising the word line proximate the substrate back surface electrically connected to a word line within a memory bitcell transistor; and a memory cell transistor array proximate the substrate front surface.

In Example 22, the subject matter of Example 21 can optionally include the source line being electrically connected to the at least one source/drain structure through a deep diffusion contact within the substrate.

In Example 23, the subject matter of Example 21 can optionally include the word line proximate the substrate back surface being electrically connected to a word line within a memory bitcell transistor through a source/drain structure and a deep diffusion contact within the substrate.

In Example 24, the subject matter of Example 21 can optionally include the memory cell transistor array comprising a plurality of resistance based memory transistors.

In Example 25, the subject matter of Example 24 can optionally include the plurality of resistance based memory transistors comprising a plurality of Spin-Transfer Torque (STT) MRAM (Magnetoresistive Random Access Memory) transistors.

In Example 26, the subject matter of Example 24 can optionally include the plurality of resistance based memory transistors comprising a plurality of ReRAM (Resistive Random Access Memory).

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic memory comprising:
    a substrate comprising a single material structure, wherein the substrate has a front surface and an opposing back surface,
    a memory bitcell transistor on the substrate front surface, wherein the memory bitcell transistor includes at least one source/drain structure formed in the substrate, wherein the source line is electrically connected to the at least one source/drain structure;
    a word line formed on the substrate back surface;
    a word line strap comprising the word line on the substrate back surface electrically connected to a word line within a memory bitcell transistor;
    a source line positioned between the word line and the substrate; and
    a memory cell transistor array on the substrate front surface.

2. The microelectronic memory of claim 1, wherein the source line is electrically connected to the at least one source/drain structure through a deep diffusion contact within the substrate.

3. The microelectronic memory of claim 1, wherein the word line on the substrate back surface is electrically connected to a word line within a memory bitcell transistor through a source/drain structure and a deep diffusion contact within the substrate.

4. The microelectronic memory of claim 1, wherein the memory cell transistor array comprises a plurality of resistance based memory transistors.

5. The microelectronic memory of claim 1, further including the source line directly contacting the substrate back surface.

6. The microelectronic memory of claim 1, wherein the memory bitcell transistor includes at least one source/drain structure formed in the substrate, wherein the source line is electrically connected to the at least one source/drain structure.

7. The microelectronic memory of claim 6, wherein the source line is electrically connected to the at least one source/drain structure through a deep diffusion contact within the substrate.

8. The microelectronic memory of claim 1, further comprising at least one metallization layer between memory bitcell transistor and memory cell transistor array.

9. The microelectronic memory of claim 1, further comprising a storage node contact between memory bitcell transistor and memory cell transistor array.

10. The microelectronic memory of claim 9, wherein the storage node contact is position directly vertically over the source line.

11. An electronic system, comprising:
    a board; and
    a microelectronic component attached to the board, wherein the microelectronic component includes a microelectronic memory comprising:
        a substrate comprising a single material structure, wherein the substrate has a front surface and an opposing back surface,
        a memory bitcell transistor on the substrate front surface, wherein the memory bitcell transistor includes at least one source/drain structure formed in the substrate, wherein the source line is electrically connected to the at least one source/drain structure;
        a word line formed on the substrate back surface;
        a word line strap comprising the word line on the substrate back surface electrically connected to a word line within a memory bitcell transistor;
        a source line positioned between the word line and the substrate; and
        a memory cell transistor array on the substrate front surface.

12. The electronic system of claim 11, wherein the source line is electrically connected to the at least one source/drain structure through a deep diffusion contact within the substrate.

13. The electronic system of claim 11, wherein the word line on the substrate back surface is electrically connected to a word line within a memory bitcell transistor through a source/drain structure and a deep diffusion contact within the substrate.

14. The electronic system of claim 11, wherein the memory cell transistor array comprises a plurality of resistance based memory transistors.

15. The electronic system of claim 11, further including the source line directly contacting the substrate back surface.

16. The electronic system of claim 11, wherein the memory bitcell transistor includes at least one source/drain structure formed in the substrate, wherein the source line is electrically connected to the at least one source/drain structure.

17. The electronic system of claim 16, wherein the source line is electrically connected to the at least one source/drain structure through a deep diffusion contact within the substrate.

18. The electronic system of claim 11, further comprising at least one metallization layer between memory bitcell transistor and memory cell transistor array.

19. The electronic system of claim 11, further comprising a storage node contact between memory bitcell transistor and memory cell transistor array.

20. The electronic system of claim 19, wherein the storage node contact is position directly vertically over the source line.

* * * * *